(12) United States Patent
Baldwin et al.

(10) Patent No.: US 6,488,821 B2
(45) Date of Patent: Dec. 3, 2002

(54) SYSTEM AND METHOD FOR PERFORMING SPUTTER DEPOSITION USING A DIVERGENT ION BEAM SOURCE AND A ROTATING SUBSTRATE

(75) Inventors: David Alan Baldwin, Annadale, VA (US); Todd Lanier Hylton, Vienna, VA (US)

(73) Assignee: 4 Wave Inc., Sterling, VA (US)

( * ) Notice: Subject to any disclaimer, the term of this patent is extended or adjusted under 35 U.S.C. 154(b) by 0 days.

(21) Appl. No.: 10/138,143

(22) Filed: May 2, 2002

(65) Prior Publication Data

US 2002/0130031 A1 Sep. 19, 2002

Related U.S. Application Data

(63) Continuation-in-part of application No. 09/810,805, filed on Mar. 16, 2001.

(51) Int. Cl.$^7$ .............................................. C23C 14/34
(52) U.S. Cl. .................................................. 204/192.11
(58) Field of Search ...................... 204/192.11, 298.04

(56) References Cited

U.S. PATENT DOCUMENTS

| | | |
|---|---|---|
| 4,250,009 A | 2/1981 | Cuome et al. |
| 4,404,233 A | 9/1983 | Ikeda et al. |
| 4,541,890 A | 9/1985 | Cuomo et al. |
| 4,793,908 A | 12/1988 | Scott et al. |
| 4,862,032 A | 8/1989 | Kaufman et al. |
| 4,920,094 A | 4/1990 | Nogawa et al. |
| 5,080,455 A | 1/1992 | King et al. |
| 5,240,583 A | 8/1993 | Ahonen |
| 5,308,461 A | 5/1994 | Anonen |
| 5,429,732 A | 7/1995 | Dave et al. |
| 5,733,418 A | 3/1998 | Hershcoritch et al. |
| 5,789,041 A | 8/1998 | Franzen |
| 5,798,027 A | 8/1998 | Lefebvre et al. |
| 6,024,851 A | 2/2000 | Radhakrishnan |
| 6,086,727 A | 7/2000 | Pinarbasi |
| 6,087,615 A | 7/2000 | Schorke et al. |
| 6,136,165 A | 10/2000 | Moslehi |

FOREIGN PATENT DOCUMENTS

JP      01 255 669 A      10/1989

OTHER PUBLICATIONS

J.L. Vossen et al., "Thin film Processes," Azademic Press Inc., 1978, pp. 175–206.

Primary Examiner—Patrick Ryan
Assistant Examiner—Gregg Cantelmo
(74) Attorney, Agent, or Firm—Morgan, Lewis & Bockius LLP

(57) ABSTRACT

A system for performing sputter disposition on a substrate. A divergent ion current source generates a divergent ion beam. The ion current source has a central axis about which ions are directed toward a surface of a negatively biased target. A rotating substrate is positioned proximate to the target. The central axis of the ion current source is normal to the surface of the target and parallel to a deposition surface of the rotating substrate.

4 Claims, 4 Drawing Sheets

SYSTEM AND METHOD FOR PERFORMING SPUTTER DEPOSITION USING A DIVERGENT ION BEAM SOURCE AND A ROTATING SUBSTRATE

The present application is a continuation-in-part of pending U.S. patent application Ser. No. 09/810,805, filed Mar. 16, 2001, incorporated herein by reference.

FIELD OF THE INVENTION

The present invention is directed generally to novel systems and methods for performing ion beam sputter deposition (IBSD), and to optical devices manufactured using such systems and methods.

BACKGROUND OF THE INVENTION

The present invention relates to ion beam sputter deposition (IBSD). More particularly, the present invention concerns a system and method for performing sputter deposition using a divergent ion beam source. It is believed that IBSD is a common technique in the manufacturing of optical filters.

The method is normally carried out in a vacuum environment by bombarding a target with ion current. The bombardment results in the dislodging of atoms from the target which are then deposited as a film on a substrate. IBSD is an improvement over other types of sputter deposition techniques because it produces films of high quality with improved adhesive properties. IBSD procedures sputtered films that have a density very similar to the bulk density of the materials used and a surface roughness which is equal to that of a super-polished substrate. These results are advantageous for optical coatings.

Performance of optical filters is further improved with deposition thickness that is uniform across the substrate. The disclosed system and method provide such an improvement.

SUMMARY OF THE INVENTION

The present invention is directed to a system for performing sputter deposition on a substrate. A divergent ion current source generates a divergent ion beam. The ion current source has a central axis about which ions are directed toward a surface of a negatively biased target. A rotating substrate is positioned proximate to the target. The central axis of the ion current source is normal to the surface of the target and parallel to a deposition surface of the rotating substrate. In one embodiment, the magnitude of ion current produced by the ion current source varies throughout the ion beam in accordance with the equation ion current $=J_o \cos(\theta)$; where $\theta$ is an angle between the central axis of the ion source and a direction of the ion current, and $J_o$ is the ion current density along the central axis.

In one embodiment, the central axis of the ion current sources intersects the center of the target. The target has a length and the substrate rotates about a rotational axis. In this embodiment, the surface of the substrate may be spaced from the central axis by half of the target length, and the surface of the target may be spaced from the rotational axis by half the target length.

Still another aspect of the invention is an optical filter, which is created by the disclosed method and process. The optical filter comprises a substrate, and material deposited on the substrate by the disclosed process and method.

BRIEF DESCRIPTION OF THE DRAWINGS

The accompanying drawings, which are incorporated herein and constitute part of this specification, illustrate presently preferred embodiments of the invention, and, together with the general description given above and the detailed description given below, serve to explain features of the invention. In the Drawings.

DETAILED DESCRIPTION OF THE PREFERRED EMBODIMENTS

It is an objective of the present invention to improve the process of ion beam sputter deposition such that uniformity of film deposition thickness across the plane of the substrate is enhanced.

Figure 1:
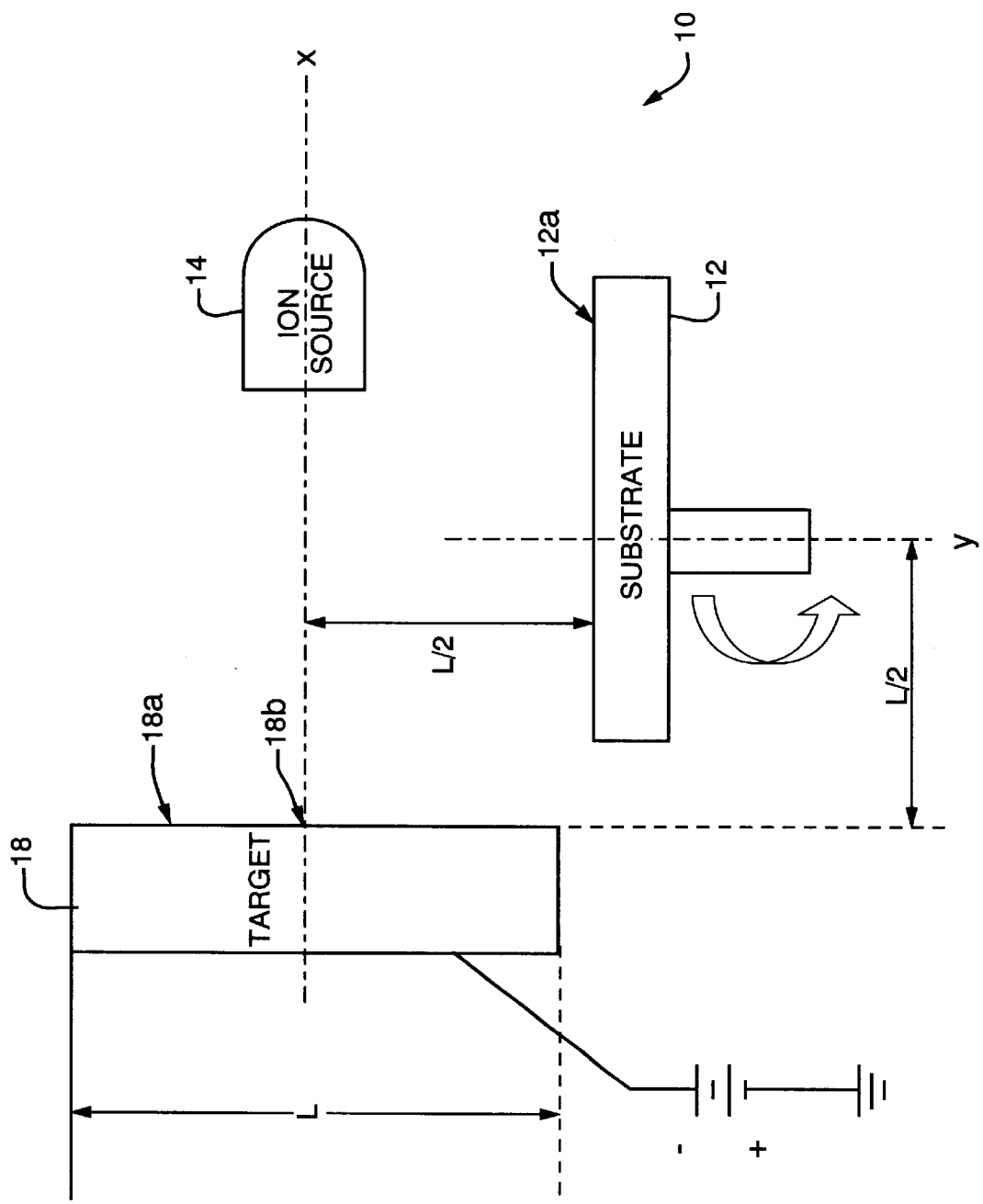
FIG. 1 is a diagram of a system for performing sputter deposition using a divergent ion beam source and a rotating substrate according to the present invention.

There is shown in FIG. 1, a system 10 for performing sputter deposition on a rotating substrate 12. The system comprises a divergent beam ion source 14 having a central axis x about which ions are accelerated toward a negatively biased target 18. The ion source may be of the Hall-current-type or any ion source with a largely diffusive flux of ions out region of concentrated plasma which are well know in the art. These types of sources are based upon gaseous ionization and are able to provide amperes of charged particle current. Ion source 14 is optionally able to generate its charged particles independently and in the absence of the other sources or plasma processes in the vacuum chamber.

A divergent ion current beam is produced by the ion source 14. The magnitude of the divergent ion current beam is characterized by an ion current distribution that varies in accordance with the equation: ion current $=J_o \cos(\theta)$; where $\theta$ is an angle between the central axis x and a direction of the ion current, and $J_o$ is the ion current density along the central axis x.

A rotating substrate 12 is positioned proximate to the target 18. The substrate 12 rotates about an axis y, which is generally normal to the surface 12a of the substrate. The central axis x is normal to a surface 18a of the target 18 and parallel to a surface 12a of the substrate 12. In one embodiment, central axis x intersects the center 18b (or approximately the center) of target 18. Also, in the embodiment of FIG. 1, target surface 18a has a length (L), the distance between the substrate surface 12a and the central axis is L/2 (or approximately L/2), and the distance between the target surface 18a and rotational axis y is L/2.

In the embodiment described above, various components and axes are described as being parallel or normal to each other, various axes are described as passing through certain center points and being spaced away from certain surfaces by specified distances, and a cosine function is specified as describing characteristics of a given divergent ion beam source. It will be understood by those skilled in the art that, such components and axes may be slightly offset from parallel or normal (rather than being precisely parallel or normal), such axes may pass through points generally proximate the described center points (rather than precisely through the geometric centers described above), and be spaced away from the surfaces by amounts approximately equal to (but not precisely the same as) the specific distances described above, and a function that approximately conforms to a cosine function may be used to describe the divergent ion beam source. Such deviations represent a matter of design choice (e.g., in certain applications requiring less precision greater deviation from the exact geometric limitations described above may be tolerated), and such deviations are within the scope of the present invention.

Figure 3:
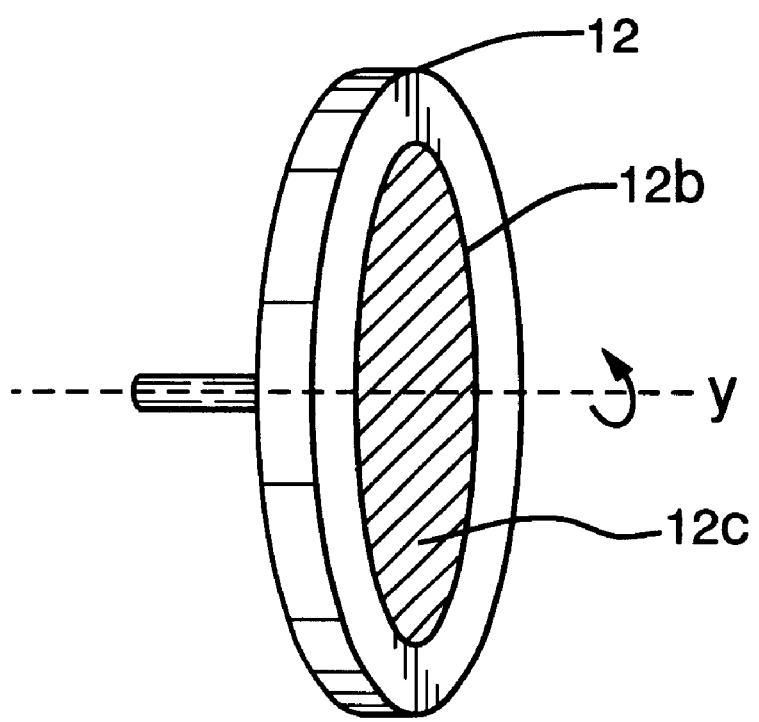
FIG. 3 is a diagram illustrating a ring on a substrate within which substantially uniform deposition thickness is achieved, in accordance with the present invention.

System 10 may be advantageously used to improve the uniformity of deposition thickness on substrate 12. In particular, by arranging the components of system 10 as shown in FIG. 1, the rate at which material from the target 18 is sputtered onto the substrate 12 can be substantially uniform across a substantial portion of substrate 12. In one embodiment, use of system 10 results in a substantially uniform deposition rate within a ring 12b (shown in separate FIG. 3) centered about the axis of rotation y of the substrate 12. Ring 12b encloses a disk-shaped region 12c which has a surface area that is at least 25% or more of the surface area of the target 18.

Figure 2:
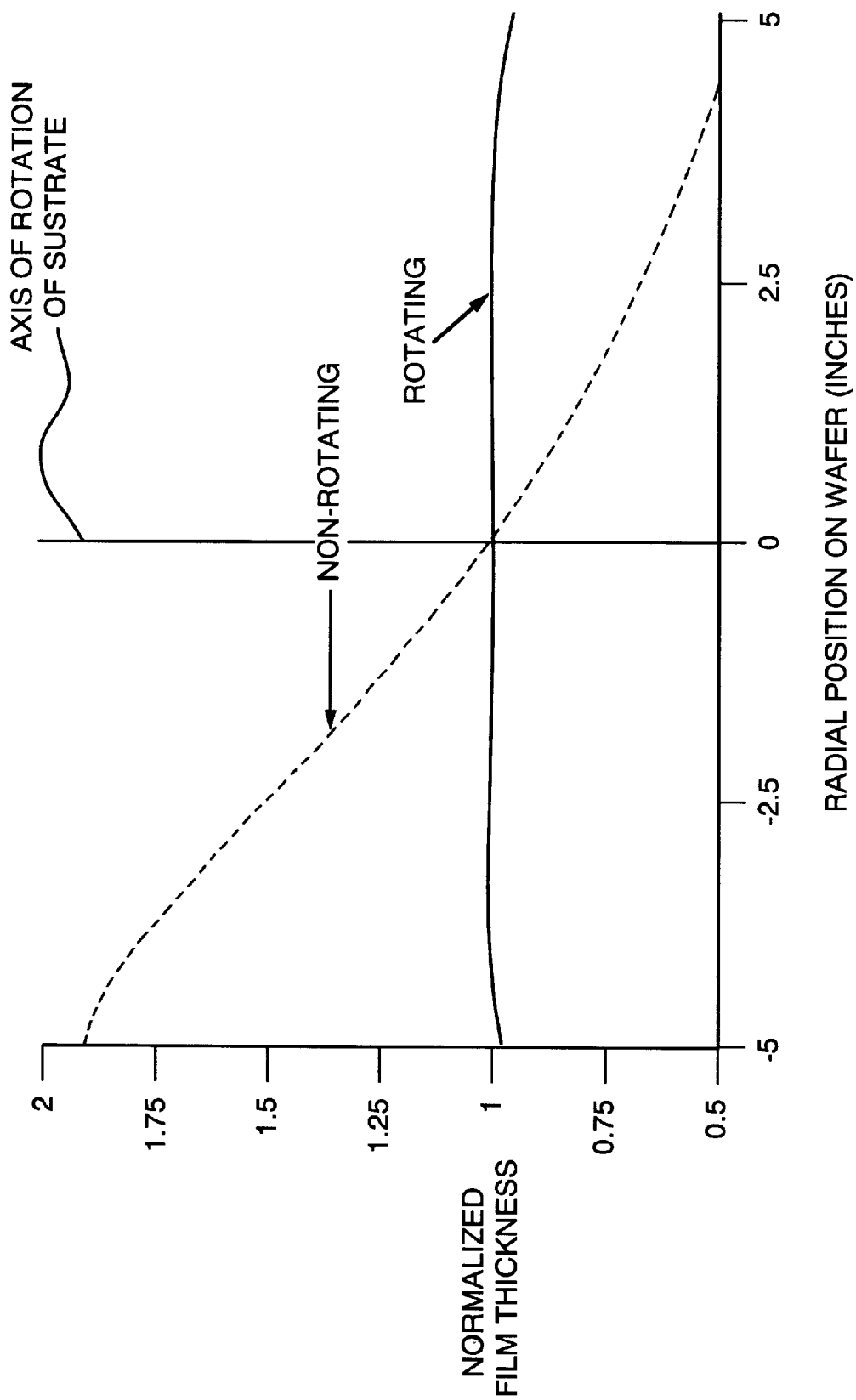
FIG. 2 is a chart that illustrates the relationship between the "radial position on wafer (inches)" vs. the "normalized film thickness" according to the present invention.

FIG. 2 illustrates the improvements made by above described system. The results in FIG. 2 assume a geometry as in FIG. 1 and a 12 inch target diameter. While FIG. 2 is illustrative of one substrate and target dimension, the invention would work equally well on substrates and targets of various shapes and sizes. As is well known to those skilled in the art, the normalized film thickness formed on substrates using known IBSD processes with right angle geometry and a non-rotating substrate can vary significantly across the substrate width. Such a variation is illustrated by the short dashed line on FIG. 2. However, as indicated by the solid line in FIG. 2, where the rotation of the substrate is introduced and a divergent beam ion source is used as shown in FIG. 1, the uniformity of film thickness is dramatically improved.

As shown in FIG. 2, for a 10 inch diameter portion of the substrate, film thickness uniformity (i.e., the ratio of the minimum deposition thickness anywhere on the 10 inch portion of the substrate surface over the maximum deposition thickness on the 10 inch portion of the substrate surface) is better than 96.5%. More particularly, FIG. 2 illustrates the 96.5% uniformity ratio with respect to a central portion of the substrate deposition surface having a 10 inch diameter i.e., FIG. 2 illustrates the claimed 96.5% deposition thickness uniformity ratio over a radial range of +5 inches to −5 inches on the substrate deposition surface. As mentioned above, the results of FIG. 2 are applicable to use of a 12 inch diameter target with the geometry of FIG. 1. Thus, the relative diameters of the deposition and target surfaces disclosed herein (and applicable to the 96.5% ratio) are 10 and 12, respectively. It will be understood by those skilled in the art that the results of the present invention may be applied to any geometry that scales the geometry described above. Accordingly, the present invention can be used to achieve the 96.5% uniformity ratio (or better) over any deposition surface portion having a diameter D so long as the diameter of the target surface is at least 1.2D.

Also as shown in FIG. 2, for a 7 inch diameter portion of the substrate, film thickness uniformity (i.e., the ratio of the minimum deposition thickness anywhere on the 7 inch portion of the substrate surface over the maximum deposition thickness on the 7 inch portion of the substrate surface) is better than 99.8%. More particularly, FIG. 2 illustrates the 99.8% uniformity ratio with respect to a central portion of the substrate deposition surface having a 7 inch diameter i.e., FIG. 2 illustrates the claimed 99.8% deposition thickness uniformity ratio over a radial range of +3.5 inches to −3.5 inches on the substrate deposition surface. As mentioned above, the results of FIG. 2 are applicable to use of a 12 inch diameter target with the geometry of FIG. 1. Thus, the relative diameters of the deposition and target surfaces disclosed herein (and applicable to the 99.8% ratio) are 7 and 12, respectively. It will be understood by those skilled in the art that the results of the present invention may be applied to any geometry that scales the geometry described above. Accordingly, the present invention can be used to achieve the 99.8% uniformity ratio (or better) over any deposition surface portion having a diameter D so long as the diameter of the target surface is at least (12/7)D.

The present invention also includes a novel method for performing sputter deposition on a substrate. The method utilizes the system described above and comprises the accelerating of ions toward the negatively biased target 18 by a divergent ion beam source 14. The divergent ion beam source 14 has a central axis x about which the ions are accelerated. The ion current produced by the ion source varies in accordance with the equation: ion current =$J_o$ cos ($\theta$); where $\theta$ is an angle between the central axis and a direction of the ion current, and $J_o$ is an ion current density along the central axis. The method further comprises the step of rotating, about axis y, the substrate 12 positioned proximate to the target 18. The central axis of the ion source x may be normal to the surface 18a of the target and parallel to the surface 12a of the substrate. In one embodiment, the central axis x intersects target 18 at its center 18b, or at a point approximately equal thereto.

Figure 4A:
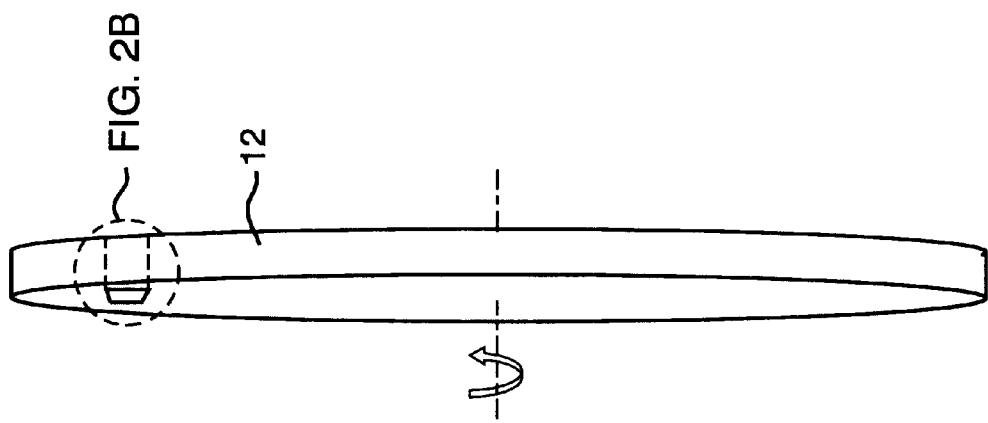
FIG. 4 depicts an optical filter formed using the system and method of the present invention.
Figure 4B:
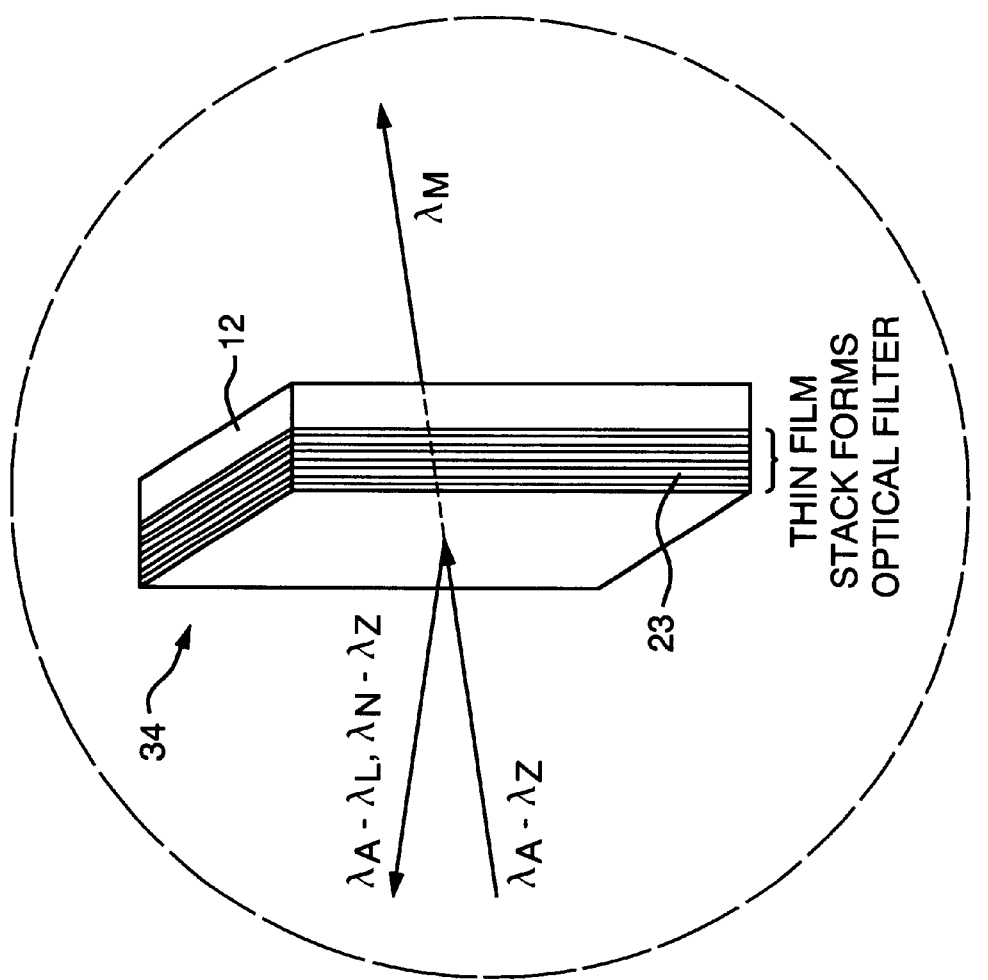

There is also a novel product that results from the performance of the novel process described above. The product is an optical filter 34, as shown in FIG. 4. The filter comprises a substrate and the material deposited on the substrate using the system and method described above. In the case of the optical filter, the substrate is preferably formed from glass or other suitably transparent material, the material deposited on the substrate is metal oxide and/or metal fluoride layer stacks, and the thickness of the material deposited on the substrate corresponds to the wavelength of light that the filter will serve to isolate.

It will be appreciated by those skilled in the art that changes could be made to the embodiments described above without departing from the broad inventive concept thereof. It is understood, therefore, that this invention is not limited to the particular embodiments disclosed, but is intended to cover modifications within the spirit and scope of the present invention as defined in the appended claims.

What is claimed is:

1. A method for performing sputter deposition on a substrate, the method comprising the steps of:

(a) directing ions toward a surface having a diameter 1.2D on a negatively biased target using a divergent ion current source that generates a divergent ion beam, the divergent ion current source having a central axis about which the ions are directed toward the target;

(b) rotating a substrate positioned proximate to the target, wherein a ratio of a minimum deposition thickness of material from the target anywhere on a deposition surface having a diameter D on the substrate over the maximum deposition thickness anywhere on the deposition surface having the diameter D is at least 96.5%; and (c) wherein the central axis is normal to the surface of the target and parallel to the deposition surface of the substrate.

2. The method of claim 1, wherein an ion current produced by the ion current source varies throughout the ion beam in accordance with the equation;

$$\text{ion current} = J_o \cos(\theta);$$

where θ is an angle between the central axis and a direction of the ion current, and $J_o$ is an ion current density along the central axis.

3. A method for performing sputter deposition on a substrate, the method comprising the steps of:
   (a) directing ions toward a surface having a diameter (12/7)D on a negatively biased target using a divergent ion current source that generates a divergent ion beam, the divergent ion current source having a central axis about which the ions are directed toward the target;
   (b) rotating a substrate positioned proximate to the target, wherein a ratio of a minimum deposition thickness of material from the target anywhere on a deposition surface having a diameter D on the substrate over the maximum deposition thickness anywhere on the deposition surface having the diameter D is at least 99.8%; and
   (c) wherein the central axis is normal to the surface of the target and parallel to the deposition surface of the substrate.

4. The method of claim 3, wherein an ion current produced by the ion current source varies throughout the ion beam in accordance with the equation;

$$\text{ion current} = J_o \cos(\theta);$$

where θ is an angle between the central axis and a direction of the ion current, and $J_o$ is an ion current density along the central axis.

* * * * *